United States Patent [19]

Takahashi

[11] Patent Number: 5,323,346

[45] Date of Patent: Jun. 21, 1994

[54] SEMICONDUCTOR MEMORY DEVICE WITH WRITE-PER-BIT FUNCTION

[75] Inventor: Masayoshi Takahashi, Kanagawa, Japan

[73] Assignee: NEC Corporation, Tokyo, Japan

[21] Appl. No.: 937,387

[22] Filed: Aug. 31, 1992

[30] Foreign Application Priority Data

Aug. 29, 1991 [JP] Japan .................................. 3-244399

[51] Int. Cl.⁵ .............................................. G11C 13/00
[52] U.S. Cl. ........................ 365/189.01; 365/189.05; 365/230.08
[58] Field of Search ..................... 365/185.01, 185, 03, 365/230.08, 230.01, 189.05

[56] References Cited

U.S. PATENT DOCUMENTS 5,124,584 6/1992 McClure ........................ 365/230.08

Primary Examiner—Terrell W. Fears
Attorney, Agent, or Firm—Sughrue, Mion, Zinn, Macpeak & Seas

[57] ABSTRACT

A semiconductor memory device equipped with a write-per-bit function includes a data-in circuit, a write-per-bit decision circuit, and a write buffer circuit. The data-in circuit and the write-per-bit decision circuit are connected to the write buffer circuit through a single common signal bus line, whereby an output signal from the data-in circuit and an output signal from the write-per-bit decision circuit are supplied to the write buffer circuit through the single signal line. The chip size as well as the number of signal lines can be reduced through such common use of the single signal line.

4 Claims, 5 Drawing Sheets

SEMICONDUCTOR MEMORY DEVICE WITH WRITE-PER-BIT FUNCTION

BACKGROUND OF THE INVENTION (1) Field of the Invention

The present invention relates to a semiconductor memory device, and more particularly to a dynamic random access memory device (DRAM) equipped with a write-per-bit function.

(2) Description of the Related Art

Conventionally, a dynamic random access memory device equipped with a write-per-bit function has a data-in circuit and a write-per-bit decision circuit that enables writing data of a particular one data input/output line selected from a plurality of data input/output lines. A conventional random access memory device having such a write-per-bit function, to which the present invention relates, is shown in FIG. 1. As shown therein, the random access memory device comprises: a data-in circuit 400 to which a signal from an input/output terminal I/O and a write enable signal $\overline{WE}$ are inputted in parallel; a write-per-bit decision circuit 401 to which a row address strobe signal $\overline{RAS}$ is supplied in addition to the signal from the I/O terminal and the write enable signal $\overline{WE}$; and a write buffer circuit 403 which writes an input data RWBS from the data-in circuit 400 in a memory cell 402 in accordance with a control signal WHSK from the write-per-bit decision circuit 401.

As shown in the timing chart of FIG. 2, the conventional dynamic random access memory device enters into its write-per-bit function mode if the write enable signal $\overline{WE}$ is low when the row address strobe signal $\overline{RAS}$ changes from high to low. At this time, which one of the plurality of data input/output terminals is subjected to the data writing operation depends on the levels of the data input/output terminals at the time when the row address strobe signal $\overline{RAS}$ changes from high to low. Specifically, if the input level at the data input/output terminal I/O is high (for example, I/Om, in FIG. 2), the write operation can be performed. On the other hand, if the input level of the data input/output terminal is low (for example, I/On, in FIG. 2), the write operation is prohibited. In this way, the data from the selected data input/output terminal I/O can be written in the memory cell 402.

There are problems in the conventional random access memory devices provided with a write-per-bit function. Namely, there is a problem that the chip area and number of signal lines increase in a dynamic random access memory device that has a large number of data input/output terminals I/O, since it is necessary to supply the output signal RWBS from each of the data-in circuits 400 and the control signal WHSK from each of the write-per-bit decision circuits 401 to the write buffer circuit 403. These are problems to be solved by the invention, in the conventional DRAM with a write-per-bit function.

SUMMARY OF THE INVENTION

It is, therefore, an object of the invention to overcome the problems existing in the convention semiconductor memory device of the kind to which the present invention relates and to provide an improved semiconductor memory device having a write-per-bit function.

The main features of the invention are that, in a semiconductor memory device equipped with a write-per-bit function and having a plurality of data input/output terminals, the device comprises a data-in circuit, a write-per-bit decision circuit and a write buffer circuit whereby an output signal from the data-in circuit and an output signal from the write-per-bit decision circuit are supplied to the write buffer circuit through a single common signal line.

BRIEF DESCRIPTION OF THE DRAWINGS

The above and other objects, features and advantages of the present invention will be apparent from the following description of a preferred embodiment of the invention explained with reference to the accompanying drawings, in which.

DESCRIPTION OF THE PREFERRED EMBODIMENT

Now, an explanation is made of a preferred embodiment according to the invention with reference to the accompanying drawings.

Figure 1:
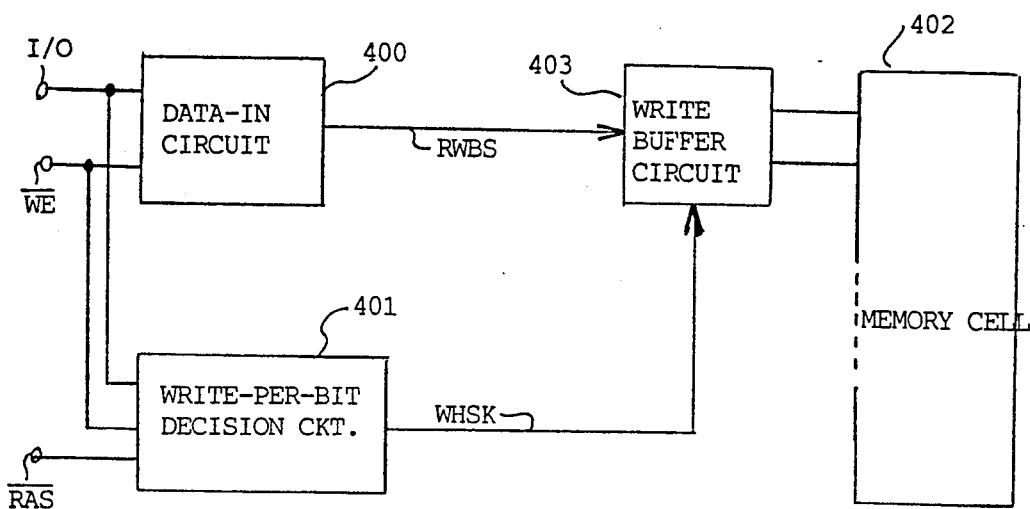
FIG. 1 is a block diagram showing a conventional dynamic random access memory device with a write-per-bit function.
Figure 2:
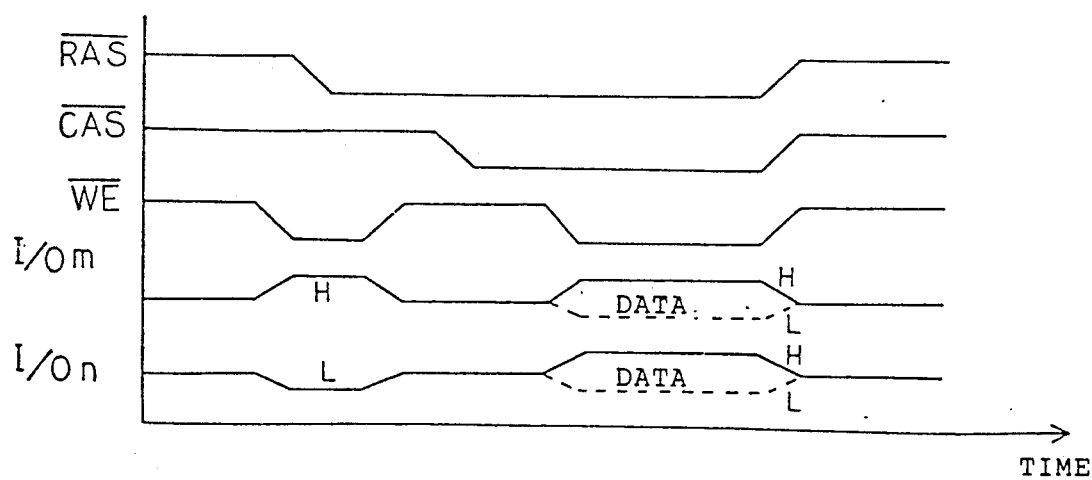
FIG. 2 is a timing chart relating to the memory device shown in FIG. 1.
Figure 3:
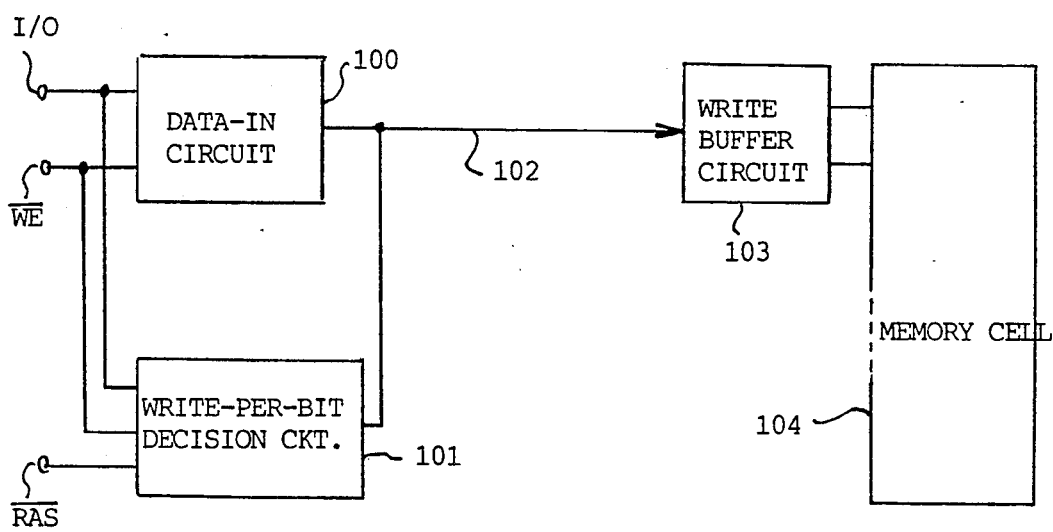
FIG. 3 is a block diagram showing a dynamic random access memory device of an embodiment according to the invention.

FIG. 3 is a block diagram showing a dynamic random access memory device of an embodiment according to the invention. As shown therein, the dynamic random access memory device includes a data-in circuit 100 which is connected to a plurality of input/output terminals I/O and a write enable signal terminal $\overline{WE}$; a write-per-bit decision circuit 101 which is connected to a row address strobe signal terminal $\overline{RAS}$ in addition to the above two terminals I/O and $\overline{WE}$; and a write buffer circuit 103 which is connected to the data-in circuit 100 and the write-per-bit decision circuit 101 through a common signal bus 102; and a memory cell 104 to which data is written from the write buffer circuit 103.

Figure 4A:
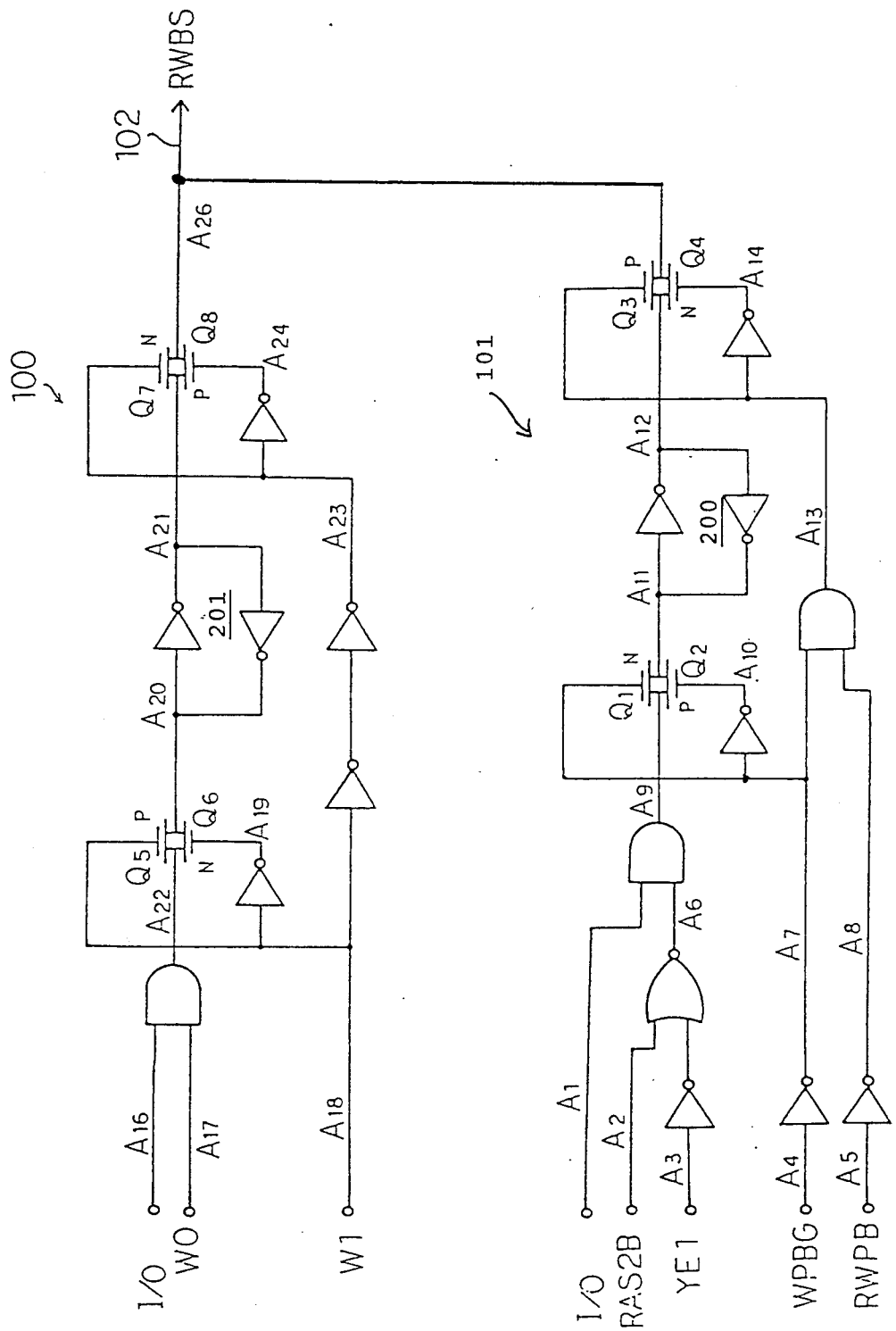
FIG. 4A is a detailed circuit diagram showing a data-in circuit and a write-per-bit decision circuit within the memory device shown in FIG. 3.
Figure 4B:
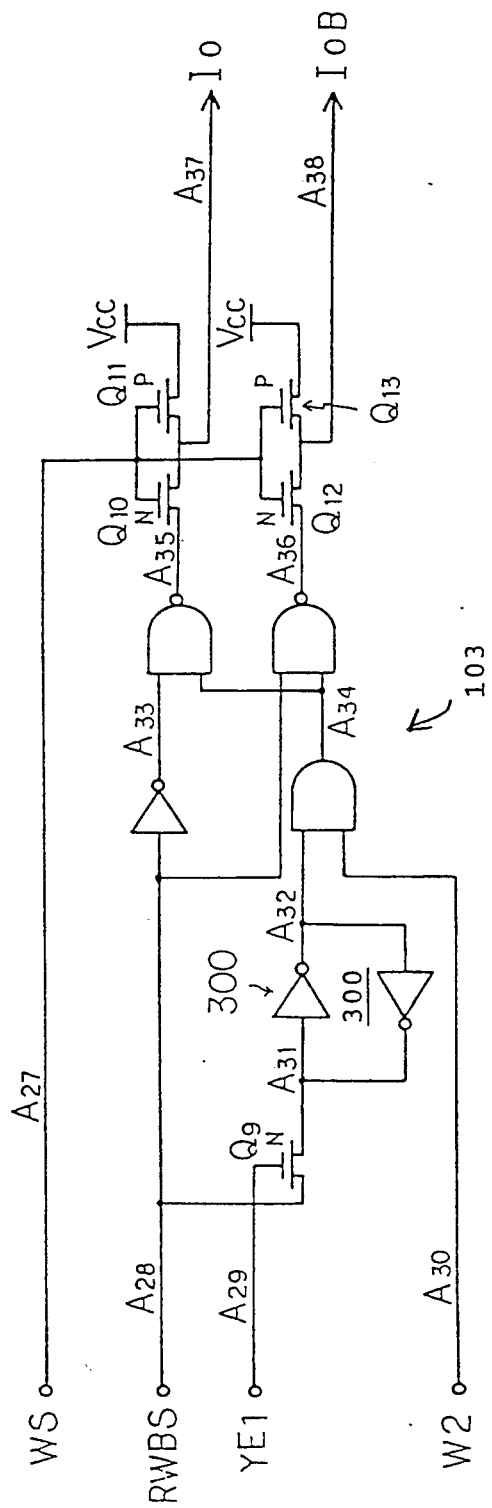
FIG. 4B is a detailed circuit diagram showing a write buffer circuit of the memory device shown in FIG. 3.
Figure 5:
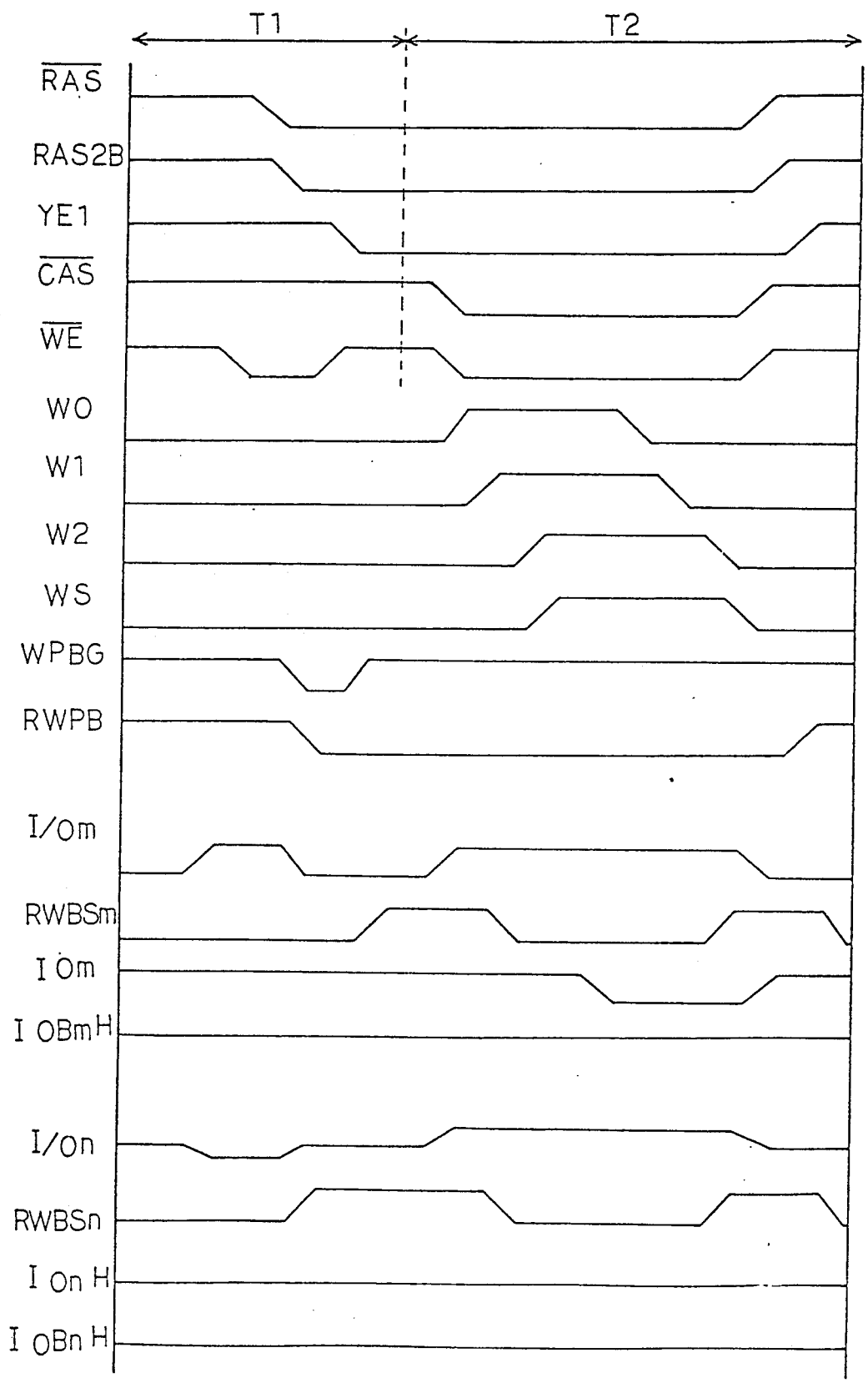
FIG. 5 is a timing chart relating to the memory device according to the invention, shown in FIG. 3.

FIG. 4A shows, in a detailed circuit diagram, the data-in circuit 100 and the write-per-bit decision circuit 101. FIG. 4B shows, in a detailed circuit diagram, the write buffer circuit 103. With reference to FIGS. 4A and 4B as well as FIG. 5 of the timing chart, the operation of the DRAM of this embodiment according to the invention is explained hereunder. In FIG. 5, "T1" shows the timing of the write-per-bit mode in which the selection or prohibition of data on the basis of levels of the data input/output lines I/O is determined. If the write enable signal $\overline{WE}$ is low when the row address strobe signal $\overline{RAS}$ changes from high to low, the memory device enters into the write-per-bit mode. At this time, if the data from the data input/output line I/O is high, the data is selected (i.e., writing is possible), and if the data from the data input/output lines I/O is low, the data is not selected (i.e., writing is prohibited). In the following explanation, the data input/output line I/Om is assumed to be a high level and the data input/output line I/On is assumed to be a low level.

First, in the case where the data input/output line I/Om is high, if the row address strobe signal $\overline{RAS}$ becomes low, the RAS2B signal (at a node A2) also becomes low, so that a node A6 becomes high and the data on the data input/output I/Om is latched accordingly. Since a pair of transistors Q1 and Q2 forming a transfer gate are turned ON in accordance with a low level of a WPBG signal at a node A4, which signal is for loading in the selected write-per-bit data, node points A9 and A11 become a high level and the data is held in a flip-flop 200 which holds the data from the input/output data lines.

Next, when an RWPB signal (at a node A5) becomes a low level, a node A13 will become high so that the low level data at the node A12 will be latched. Since a YE1 signal (at nodes A3 and A29) are high, the low data of the RWBS (at a node A28) is latched through a transistor Q9 as it is in a flip-flop 300 for holding the prohibited data. As a result, a high level data is held at an output node A32 of the flip-flop 300.

Now, if the YE1 signal (at the nodes A3 and A29) becomes a low level, then the node A6 of an OR gate will become low. As a result, the circuits after the node A9 will not operate even if the level of the data input/output lines I/O changes. Further, since the transistor Q9 in the write buffer circuit 103 turns OFF, the data in the flip-flop 300 is held as it is without being influenced by the RWBS signal at the node A28.

Next, in the case where the level of the data input/output line I/On is low, the low level data of the input/output line I/On is latched only when the node A6 becomes high in the same manner as the previously described case wherein the level of the data input/output line I/Om is high. Thus, the nodes A9 and A11 become low and, thus, the node A12 and the RWBS data at the node A28 become high. The flip-flop 300 holds the high level data, so that the level at the output node A32 becomes low. Thereafter, the low level data is held thereat after the YE1 signal at the nodes A3 and A29 becomes low.

Timing "T2" in the FIG. 5 chart represents an ordinary data write operation of the dynamic random access memory. Under the state in which the row address signal $\overline{RAS}$ is a low level, when both the column address strobe signal $\overline{CAS}$ and the write enable signal $\overline{WE}$ become low, a low or a high level data from the data input/output line is written to the memory cell.

In the data-in circuit 100 shown in FIG. 4A, when the write enable signal $\overline{WE}$ becomes low, the WO signal (at a node A17) will become high, so that the data on the data input/output line I/O (at a node A16) is latched. Since a W1 signal (at a node A18) is first low, transistors Q5 and Q6 are ON, so that the data in the data input/output line I/O is held in a flip-flop 201. Next, when the W1 signal (at the node A18) changes from a low level to a high level, transistors Q7 and Q8 will be turned ON and, thus, a complement data with respect to the data on the data input/output lines I/O will be transferred to the RWBS line (at the node A26). Then, the transistors Q5 and Q6 turn OFF and, thus, the circuits after the node A20 are in a state wherein they are not influenced by the data input/output line.

In the write-per-bit mode, if the level of the data held in the flip-flop 300 (at the output node A32) in the write buffer 103 is high, the writing of data in the memory cell 104 is possible. On the other hand, if the output node A32 of the flip-flop 300 is low, the writing is prohibited. During the period in which the node A32 is kept at a high level, when the W2 signal (at the node A30) becomes high, the level at the node A34 will also become high. As the level of the RWBS signal at the node A28 is a low or a high level, either a node A35 or a node A36 will definitely become low. Further, if the WS signal (at a node A27) becomes high, transistors Q10 and Q12 turn ON, so that output levels at IO (at a node A37) and IOB (at a node A38) will become high and low, respectively, whereby the data from the input/output line (I/O line) will be written to the memory cell 104.

Contrary to the above, during the period in which the node A32 keeps a low level, since the level at node A34 is a low level irrespective of the level of the W2 signal at the node A30, the nodes A35 and A36 both become high even if the RWBS signal at the node A28 has arrived. Therefore, even if the transistors Q10 and Q12 are turned ON based on the high level of the WS signal at the node A27, the IO at the node A37 and IOB at the node A38 both keep a high level. Consequently, the I/O data from the data input/output line cannot be written to the memory cell 104.

As explained above, both the data-in circuit 100 and the write-per-bit decision circuit 101 can be connected to the write buffer 103 through the single common signal line 102.

Thus, the present invention enables to achieve advantages that the chip size as well as the necessary number of signal lines can be reduced through the common use of a single output line for both the data-in circuit and the write-per-bit decision circuit.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A semiconductor memory device having a plurality of data input/output terminals and a write-per-bit function, said memory device comprising:

a memory cell array in a matrix array form;

a data-in circuit having an input terminal and an output terminal, said input terminal connected to one of said data input/output terminals, for taking-in an input data therein and outputting a write data to said output terminal;

a write-per-bit decision circuit having an external signal input terminal and an output terminal, for outputting a control signal which permits or prohibits writing of said write data from said data-in circuit in said memory cell array in response to an external signal applied to said external signal input terminal;

a write buffer circuit having an input terminal for taking-in said write data from said data-in circuit and an output terminal for outputting said write data to said memory cell array, said write buffer circuit being activated or inactivated in response to the control signal from said write-per-bit decision circuit; and a single common signal bus line commonly connecting said output terminal of said data-in circuit and said output terminal of said write-per-bit decision circuit to said input terminal of said write buffer circuit.

2. A semiconductor memory device according to claim 1, in which said data-in circuit and said write-per-bit decision circuit output respectively output signals which are supplied to said write buffer circuit through said common signal bus line.

3. A semiconductor memory device having a plurality of data input/output terminals and write enable signal terminals and a write-per-bit function, said memory device comprising:

- a data-in circuit having input terminals and an output terminal, said input terminals respectively connected to one of said data input/output terminals and one of said write enable signal terminals, for taking-in an input data therein and outputting a write data to said output terminal;
- a write-per-bit decision circuit having input terminals respectively connected to the one of said data input/output terminals, the one of said write enable signal terminals and a row address strobe signal terminal, for outputting a control signal which permits or prohibits writing of said write data from said data-in circuit in said memory cell array in response to a row address strobe signal applied to said row address strobe signal terminal;
- a write buffer circuit having an input terminal for taking-in said write data from said data-in circuit and an output terminal for outputting said write data to said memory cell array, said write buffer circuit being activated or inactivated in response to the control signal from said write-per-bit decision circuit; and
- a single common signal bus line commonly connecting said output terminal of said data-in circuit and said output terminal of said write-per-bit decision circuit to said input terminal of said write buffer circuit.

4. A semiconductor memory device according to claim 3, in which said data-in circuit and said write-per-bit decision circuit output respectively output signals which are supplied to said write buffer circuit through said common signal bus line.

* * * * *